United States Patent [19]
Lian

[11] Patent Number: 5,495,230
[45] Date of Patent: Feb. 27, 1996

[54] MAGNETOMECHANICAL ARTICLE SURVEILLANCE MARKER WITH A TUNABLE RESONANT FREQUENCY

[75] Inventor: Ming-Ren Lian, Clearwater, Fla.

[73] Assignee: Sensormatic Electronics Corporation, Deerfield Beach, Fla.

[21] Appl. No.: 288,556

[22] Filed: Aug. 10, 1994

Related U.S. Application Data

[63] Continuation-in-part of Ser. No. 269,651, Jun. 30, 1994, Pat. No. 5,469,140.

[51] Int. Cl.$^6$ ............................................. G08B 13/24
[52] U.S. Cl. .................... 340/551; 340/572; 361/143; 361/149
[58] Field of Search ............................ 340/551, 572; 361/149, 143, 152, 147, 148

[56] References Cited

U.S. PATENT DOCUMENTS

| | | | |
|---|---|---|---|
| 2,792,532 | 5/1957 | Becker | 361/147 |
| 3,747,086 | 7/1973 | Peterson | 340/572 |
| 4,510,489 | 4/1995 | Anderson, III et al. | 340/572 |
| 4,647,910 | 3/1987 | Torre | 340/551 |
| 5,252,144 | 10/1993 | Martis | 148/121 |

*Primary Examiner*—Glen Swann
*Attorney, Agent, or Firm*—Robin, Blecker, Daley & Driccoll

[57] ABSTRACT

A marker for use in a magnetomechanical electronic article surveillance (EAS) system is made by mounting a magnetostrictive element in a housing adjacent to a biasing element that is magnetized to a degree of magnetization that is less than saturation. The resonant frequency of the marker is detected. If the detected resonant frequency does not match a predetermined operating frequency of the EAS system, the degree of magnetization of the biasing element is adjusted so as to tune the resonant frequency of the marker to the predetermined operating frequency.

35 Claims, 11 Drawing Sheets

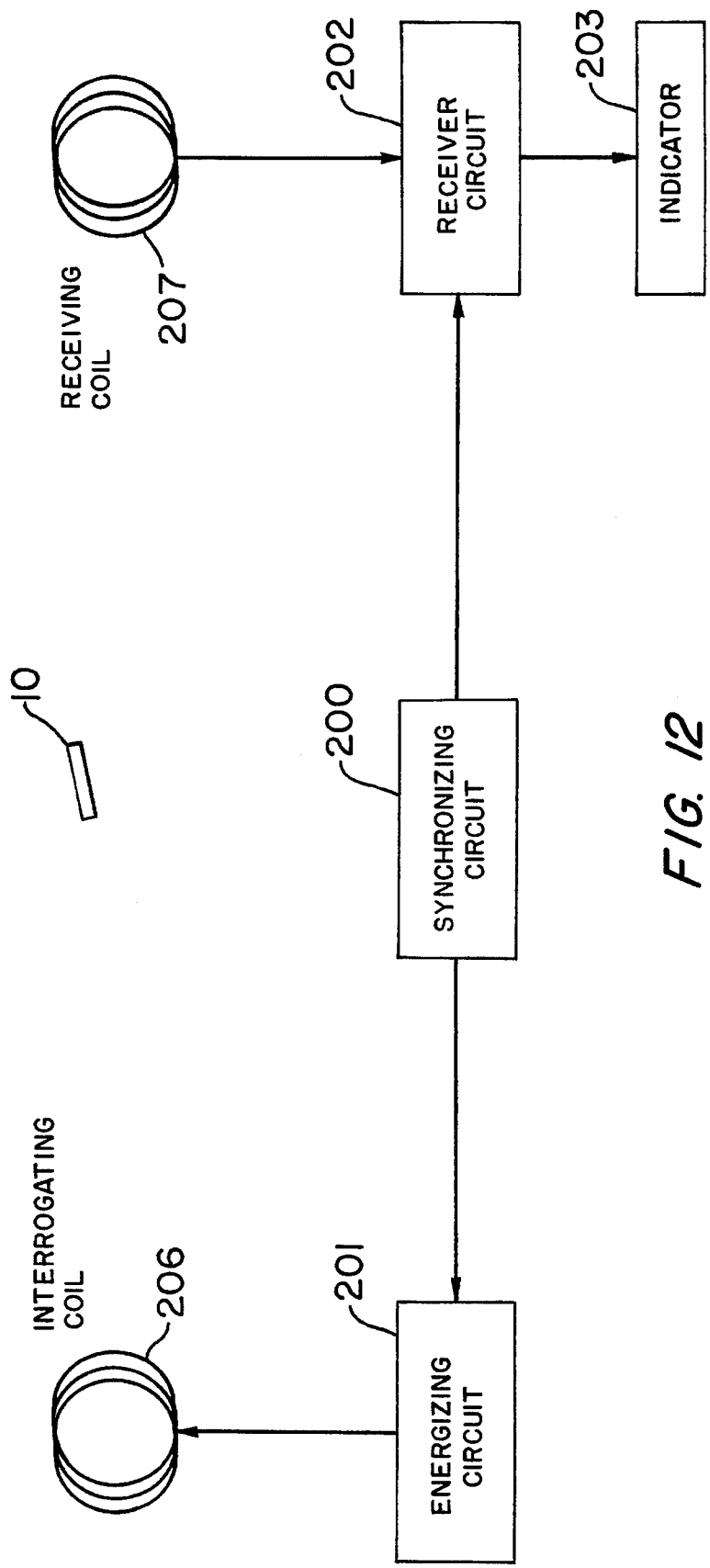

MAGNETOMECHANICAL ARTICLE SURVEILLANCE MARKER WITH A TUNABLE RESONANT FREQUENCY

REFERENCE TO RELATED APPLICATION

This application is a continuation-in-part of U.S. Pat. application Ser. No. 08/269,651, filed on Jun. 30, 1994, U.S. Pat. No. 5,469,140.

FIELD OF THE INVENTION

This invention relates to magnetomechanical markers used in electronic article surveillance (EAS) systems, and methods of making same.

BACKGROUND OF THE INVENTION

It is well known to provide electronic article surveillance systems to prevent or deter theft of merchandise from retail establishments. In a typical system, markers designed to interact with an electromagnetic or magnetic field placed at the store exit are secured to articles of merchandise. If a marker is brought into the field or "interrogation zone", the presence of the marker is detected and an alarm is generated. Some markers of this type are intended to be removed at the checkout counter upon payment for the merchandise. Other types of markers are deactivated upon checkout by a deactivation device which changes an electromagnetic or magnetic characteristic of the marker so that the marker will no longer be detectable at the interrogation zone.

One type of magnetic EAS system is referred to as a harmonic system because it is based on the principle that a magnetic material passing through an electromagnetic field having a selected frequency disturbs the field and produces harmonic perturbations of the selected frequency. The detection system is tuned to recognize certain harmonic frequencies and, if present, causes an alarm.

Another type of EAS system employs magnetomechanical markers that include a magnetostrictive element. For example, U.S. Pat. No. 4,510,489, issued to Anderson et al., discloses a marker formed of a ribbon-shaped length of a magnetostrictive amorphous material contained in an elongated housing in proximity to a biasing magnetic element. The magnetostrictive element is fabricated such that it is resonant at a predetermined frequency when the biasing element has been magnetized to a certain level. At the interrogation zone, a suitable oscillator provides an AC magnetic field at the predetermined frequency, and the marker mechanically resonates at this frequency upon exposure to the field when the biasing element has been magnetized to a certain level.

According to one technique disclosed in the Anderson et al. patent, the marker has, in addition to the aforesaid resonant frequency, an "anti-resonant frequency" at which the stored mechanical energy resulting from magneto-mechanical coupling is near zero. An interrogation circuit which provides the magnetic field at the interrogation zone is swept through a frequency range that includes the marker's resonant and anti-resonant frequencies, and receiving circuitry is provided at the interrogation zone to detect the marker's characteristic signature by detecting a peak transmitted energy level which occurs at the resonant frequency, and a valley level at the anti-resonant frequency.

Anderson et al. also propose that the magnetostrictive element be subjected to annealing in the presence of a magnetic field to enhance a magneto-mechanical coupling factor k. According to Anderson et al., a larger coupling factor k increases the detectability of the marker's characteristic signature.

In still another surveillance system proposed by Anderson et al., a magnetostrictive marker is used with an interrogation frequency that is not swept, but rather remains at the marker's resonant frequency. The interrogation field at this frequency is provided in pulses or bursts. A marker present in the interrogation field is excited by each burst, and after each burst is over, the marker undergoes a damped mechanical oscillation. The resulting signal radiated by the marker is detected by detecting circuitry which is synchronized with the interrogation circuit and arranged to be active during the quiet periods after bursts. EAS systems of this pulsed-field type are sold by the assignee of this application under the brand name "Ultra*Max" and are in widespread use.

For markers used in pulsed-interrogation systems, the amplitude and duration of oscillations which the magnetostrictive element continues to exhibit after the end of each excitation pulse are very important. The greater the amplitude and duration of the residual oscillations (known as "ring down"), the more unique is the signal during the quiet period in the interrogating zone, and therefore the easier it is for the marker to be detected by the detecting circuitry.

In order to provide the desired ring down amplitude and duration, it is advantageous that the magnetomechanical marker exhibit a quality factor (referred to as "Q") in the range of 250 to 300. The quality factor Q varies inversely with the bandwidth of the marker, and it is therefore desirable that the marker have a very narrow bandwidth. However, because of the narrowness of the bandwidth around the marker's resonant frequency, the ring down amplitude is very much adversely affected if the resonant frequency of the marker deviates from the frequency of the interrogation field.

According to a conventional technique for fabricating magnetomechanical markers, the magnetostrictive element is formed by cutting a strip from a long ribbon-shaped casting of an amorphous material known as Metglas® 2826MB (which has a composition of $Fe_{40}Ni_{38}Mo_4B_{18}$). Each strip is then mounted in a housing together with a semi-hard magnet which has been magnetized to saturation to provide a bias field for the magnetostrictive element.

It has been found that the as-cast Metglas ribbon exhibits variations in material composition along the length of the ribbon so that respective strips cut along the length exhibit different magnetostrictive properties. The variation in the resulting magnetostrictive elements is so great that, according to one manufacturing process, it is necessary to measure the resonant frequency of each strip. If required, the length to which each strip is cut, after the third strip of a batch, is adjusted based on the measured resonant frequencies of the previous three strips. In general, the cut length must be adjusted often, sometimes for every strip, and generally after no more than five or six strips. Thus, to compensate for the variation in the conventional as-cast material, the conventional process for manufacturing magnetostrictive elements includes frequent testing of the resonant frequency of the cut strips, and then adjusting the length to which the strips must be cut to obtain the desired resonant frequency. This process is both labor intensive and time consuming. Also, the production yield resulting from this process is less than optimal, since the necessary adjustments in the cut length can not always be predicted with sufficient accuracy to make up for the variations in material. As a result, some of the markers produced by this process fail to have the desired resonant frequency and must be discarded.

There are other factors which may also cause the resonant frequency of a marker to deviate from the desired frequency. For example, the marker's resonant frequency may be shifted from the desired frequency because the strength of the biasing field provided by the biasing element deviates from a standard level. The deviation of the biasing field may be due to variations in the size (e.g. thickness) or composition of the biasing element, or the method of processing used in forming the biasing element. The shift in the marker's resonant frequency because of deviation in the biasing field cannot be detected until after the marker has been assembled, and thus cannot be compensated for by adjusting the length of the magnetostrictive element, which is formed by a cutting operation prior to assembly of the marker.

Another matter of concern is deactivation of the marker. Deactivation of magnetomechanical markers is typically performed by degaussing the biasing element so that the magnetostrictive element ceases to be mechanically resonant or its resonant frequency is changed. However, when the biasing element is degaussed, although the marker is no longer detectable in a magnetomechanical surveillance system, the magnetostrictive element may nevertheless act as an amorphous magnetic element which can still produce harmonic frequencies in response to an electromagnetic interrogating field. This is undesirable because after a purchaser of an item bearing the magnetomechanical marker has had the marker degaussed at the checkout counter, that purchaser may then enter another retail shop where a harmonic EAS system may be in use and where it would be possible for the degaussed marker to set off an alarm because it may generate harmonic frequencies in response to an interrogation signal in the second retail store.

OBJECTS AND SUMMARY OF THE INVENTION

It is accordingly a primary object of the invention to provide a magnetomechanical marker that is suitable for use in a pulsed-field EAS interrogation system. It is another object of the invention to provide a magnetostrictive marker that is easier to manufacture than conventional magnetomechanical markers. It is still another object to provide a more flexible process for manufacturing magnetomechanical markers.

It is a further object to provide a magnetomechanical marker that, when deactivated, does not generate harmonic signals of substantial amplitude in response to interrogation by harmonic EAS systems.

It is yet another object of the invention to provide a magnetomechanical marker that is thinner than conventional magnetomechanical markers.

According to an aspect of the invention, there is provided a method of making a marker for use in a magnetomechanical electronic article surveillance system, including the steps of providing an amorphous magnetostrictive element, mounting a biasing element adjacent to the magnetostrictive element, magnetizing the biasing element to a degree of magnetization that is substantially less than saturation, detecting a resonant frequency of the marker after the mounting and magnetizing steps, and, if the detected resonant frequency does not match a predetermined operating frequency of the electronic article surveillance system, adjusting the degree of magnetization of the biasing element so as to tune the resonant frequency of the marker to a predetermined operating frequency of the electronic article surveillance system.

According to other aspects of the invention, the magnetizing of the biasing element is performed after the biasing element is mounted adjacent to the magnetostrictive element, and the magnetostrictive element is formed by cutting an amorphous material to form a batch of at least ten strips each of which has a preselected fixed uniform length.

According to further aspects of the invention, the biasing element is magnetized by applying thereto a magnetic field which has an AC component and a DC offset component, with the AC component having a ring-down characteristic.

According to yet another aspect of the invention, there is provided a method of making a marker for use in a magnetomechanical electronic article surveillance system, including the steps of forming the marker by mounting a biasing element adjacent to a magnetostrictive element, with the magnetostrictive element having a resonant frequency that varies according to a level of a biasing magnetic field provided by the biasing element, and then setting the resonant frequency of the magnetostrictive element to a predetermined frequency by changing a degree of magnetization of the biasing element.

According to still further aspects of the invention, the step of setting the resonant frequency of the magnetostrictive element includes testing the marker to detect the resonant frequency of the magnetostrictive element, and applying a magnetic field to said biasing element to change the degree of magnetization of the biasing element if the detected resonant frequency did not match the predetermined frequency. According to still another aspect of the invention, the magnetic field applied to the biasing element includes an AC component and a DC offset component.

According to yet another aspect of the invention, there is provided a method of making a marker for use in a magnetomechanical electronic article surveillance system, including the steps of selecting an amorphous magnetic material, cutting the material to a strip having a preselected fixed uniform length, mounting the strip adjacent to a biasing element, and setting a resonant frequency of the magnetostrictive element to a desired frequency by changing a degree of magnetization of the biasing element.

According to another aspect of the invention, the step of cutting the material includes forming a batch of strips cut to the preselected fixed uniform length, with the batch including at least ten strips.

In accordance with still another aspect of the invention, there is provided an apparatus for magnetizing a biasing element for use in an electronic article surveillance system, including a coil for generating a magnetic field to which the biasing element is exposed, and a driving circuit for energizing the coil, where the driving circuit includes an AC signal generating circuit for generating an AC signal having a ring-down characteristic, a DC signal generating circuit for generating a DC signal, circuitry for combining the AC signal having the ring-down characteristic and the DC signal to form a driving signal which includes an AC ring-down component and a DC offset component, and circuitry for applying the driving signal to the coil, whereby the magnetic field generated by the coil has an AC ring-down component and a DC offset component.

According to further aspects of the invention, the DC signal generating circuit includes structure for varying a level of the DC signal so that a level of the DC offset component of the magnetic field is varied.

BRIEF DESCRIPTION OF THE DRAWINGS

FIG. 12 is a schematic block diagram of an electronic article surveillance system which uses the magnetomechanical marker of FIG. 1.

DESCRIPTION OF THE PREFERRED EMBODIMENTS

Figure 1:
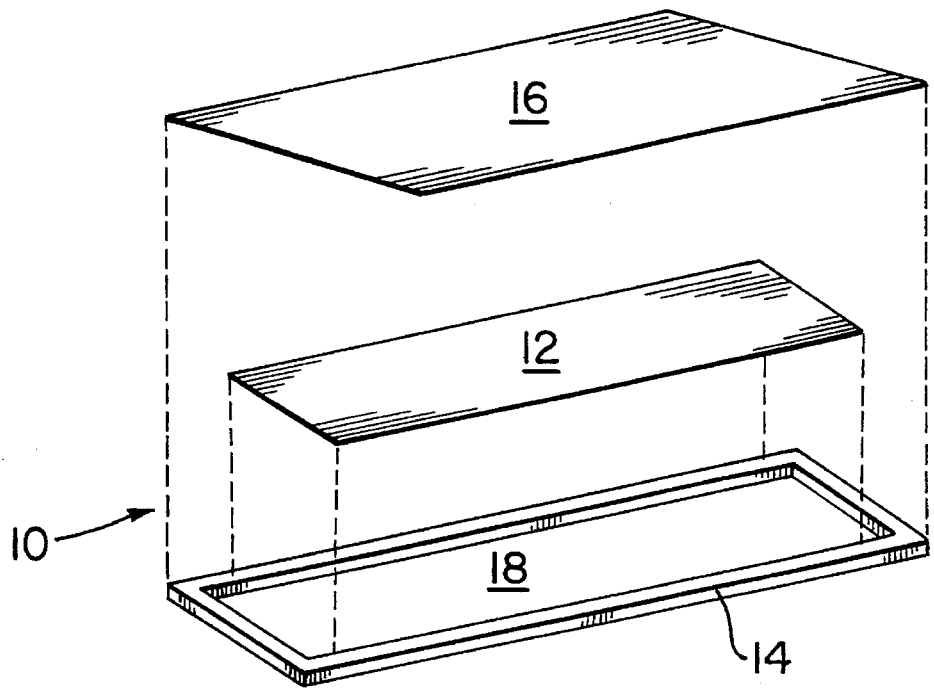
FIG. 1 is an isometric view showing components of a magnetomechanical marker provided in accordance with the present invention.

In the following description the term "magnetostrictive element" refers to the active magnetic component (element 12 shown in FIG. 1) that is capable, when properly activated, of producing a unique ring down signal in response to an interrogation signal. The term "biasing element" refers to a control element (element 16 of FIG. 1) comprised of a magnetic material having a relatively high coercivity, as compared to the coercivity of the magnetostrictive element, and which is capable of being magnetized or demagnetized (i.e., biased or unbiased) to control the mechanical resonant frequency of the magnetostrictive element. The term "marker" (generally indicated by reference numeral 10 in FIG. 1) refers to the combination of the magnetostrictive element 12 and the biasing element 16 usually contained within a housing (element 14 in FIG. 1) and capable of being attached or associated with merchandise to be protected from theft.

The magnetostrictive element 12 of FIG. 1 is like a magnetostrictive element used in a conventional marker, but, in accordance with an aspect of the invention, the magnetostrictive element 12 may be produced by cutting a ribbon of cast amorphous material at fixed intervals along the length of the ribbon to produce a batch of elements 10 all having the same fixed length. The size of the batch may be, for example, at least 10 to 50 elements. The batch size is, in theory, unlimited, and may include many thousand elements, provided that the variations in the cast material are not unduly large. It will be recognized that the cutting of the elements 12 to a fixed length is faster and more efficient than the prior art technique which required measuring characteristics of each element in order to determine the length to which subsequent elements should be cut. The fixed-length cutting technique of the present invention also prevents delay and inconvenience involved in changing the cut-length setting of equipment used to cut the amorphous material.

It is within the contemplation of the invention to form the element 12 of FIG. 1 from the conventional Metglas material referred to above. The dimensions of the element 12 may also be like those of a conventional magnetostrictive element, e.g., a flat rectangular strip about 0.5 inch wide, 1.5 inch long and 0.001 in. thick.

The biasing element 16 shown in FIG. 1 differs from a biasing element used in a conventional magnetomechanical marker in that the biasing element 16 comprises a greater quantity of magnetic material than the conventional biasing element. For example, a conventional biasing element is formed from a 0.002 in. thick strip of a semi-hard magnetic material such as Arnokrome III, cut into the shape of a parallelogram having an acute angle of about 45°, a width of about 0.5 inch and a tip-to-tip length of about 1.55 inch.

The biasing element 16 provided in accordance with the invention may be made of the same material as the conventional biasing element, but contains a greater volume of the magnetic material, 1½ to 2 times as great, for example. According to a preferred embodiment, the biasing element 16 has the same "foot print" as a conventional biasing element but is thicker than the conventional biasing element, having a thickness of about 0.003 to 0.004 inches. It is also contemplated to achieve the desired increase in volume of the biasing element by increasing one or both of the length and width of the biasing element 16, as compared to the conventional biasing element, instead of or in addition to increasing the thickness.

The magnetostrictive element 12 and the biasing element 16 may be mounted in the housing 14 of the marker 10 in accordance with conventional techniques.

Figure 2:
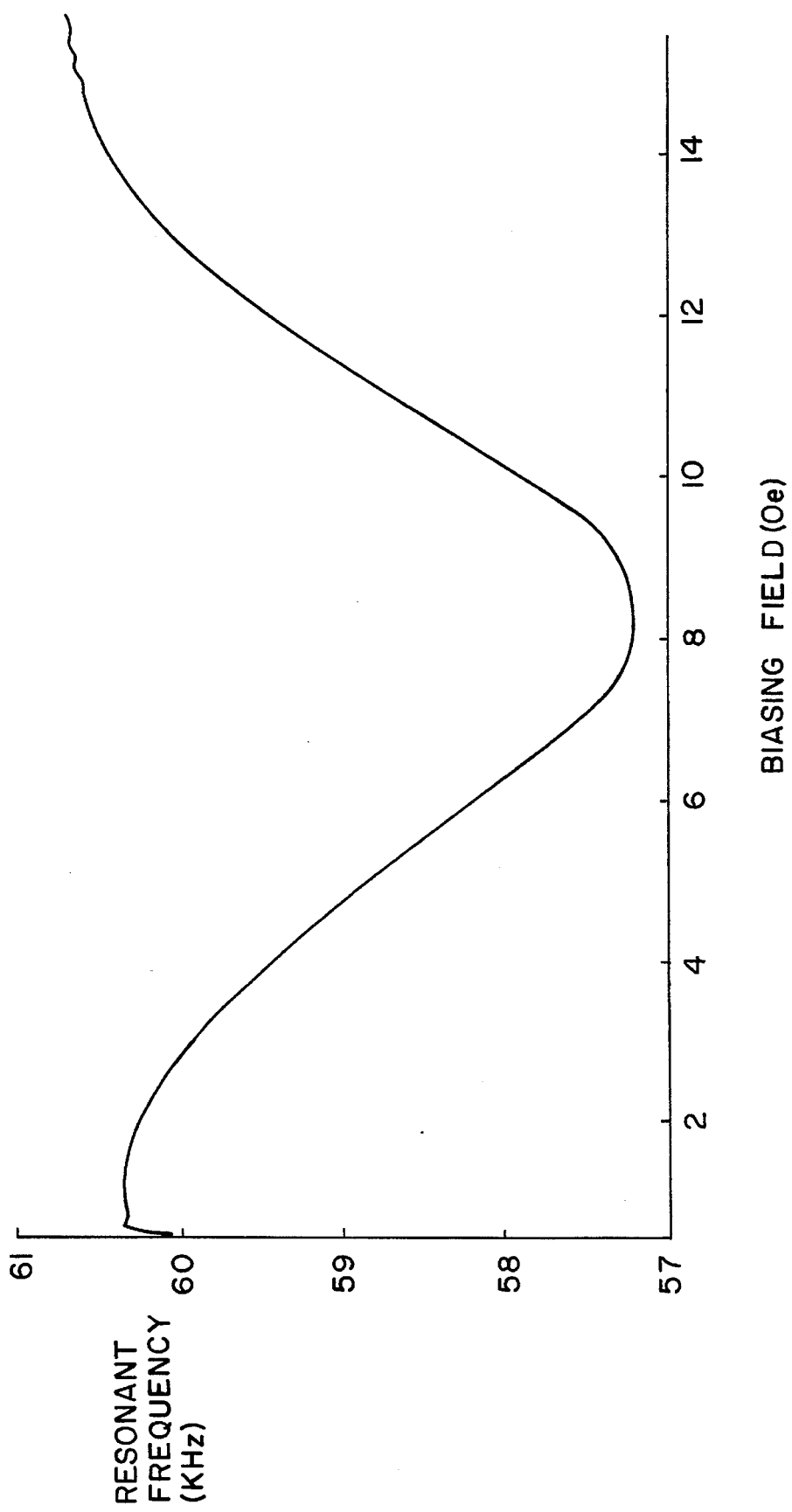
FIG. 2 is a graph showing how a resonant frequency of a magnetomechanical marker varies with changes in a biasing magnetic field provided in the marker.

FIG. 2 illustrates a characteristic of the magnetostrictive element 12 whereby the magnetomechanical resonant frequency of the element 12 varies as a function of the strength of a biasing magnetic field to which the element 12 is exposed. The results shown in FIG. 2 were obtained by exposing a magnetostrictive element like the element 12 described above to a DC magnetic field generated by a solenoid. The strength of the field was varied over a range of about 0–15 Oe. As shown in FIG. 2, the magnetostrictive element 12 exhibits a peak resonant frequency of over 60 khz at a bias field strength of about 1 Oe. As the strength of the bias field is increased, the resonant frequency of the element 12 decreases to a minimum of slightly more than 57 khz at a field strength of slightly more than 8 Oe. Then, as the field strength is further increased, the resonant frequency again increases to another peak level of about 60.5 khz at about 14 Oe. Since a standard interrogation field frequency of 58 khz is used in conventional pulsed-field magnetomechanical EAS systems, it is customary to provide a biasing field of about 6 Oe. However, as noted before, variations among magnetostrictive elements can cause the characteristic curve shown in FIG. 2 to be shifted. It will also be noted that in the neighborhood of 6 Oe, the resonant frequency changes at a rate of about 600 Hz/Oe in response to variations in the biasing field.

Figure 3:
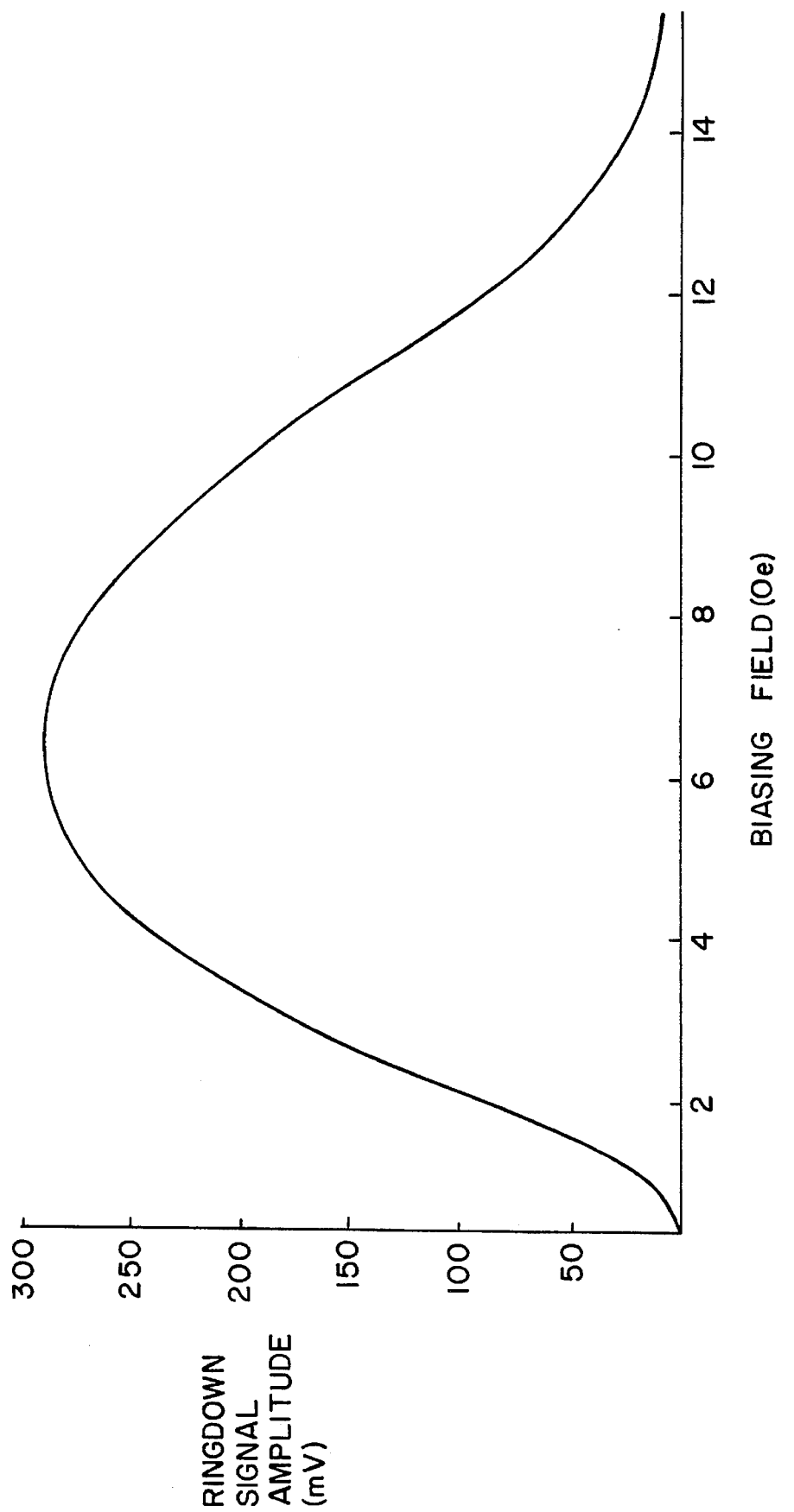
FIG. 3 is a graph showing how a ring-down signal amplitude of a magnetomechanical marker varies with changes in a biasing magnetic field provided in the marker.

FIG. 3 illustrates how a ring-down amplitude characteristic of a magnetostrictive element varies as a function of the applied biasing field. The values shown in FIG. 3 were obtained over the same range of biasing field strengths as in FIG. 2, and the values were measured 1 msec after the end of the excitation pulse of the interrogation field. It will be noted that a peak ring-down amplitude is obtained at a biasing field of about 6 Oe.

In a conventional magnetomechanical marker, the size (volume) of the biasing element is such that, when saturated, the biasing element provides a DC magnetic field of about 6 Oe for biasing the magnetostrictive element.

However, by providing a larger biasing element 16, in accordance with the invention, the biasing element 16 can be magnetized to a degree of magnetization that is less than saturated while still providing a biasing field of about 6 Oe. As will be seen, it is then possible to adjust the strength of the biasing field by adjusting the degree of magnetization of the biasing element 16, so as to tune the resonant frequency of the marker to a desired frequency e.g., the standard pulsed-field EAS frequency of 58 khz.

A method of preparing and tuning a magnetomechanical marker in accordance with the invention will now be described with reference to the flow chart shown in FIG. 4.

Figure 4:
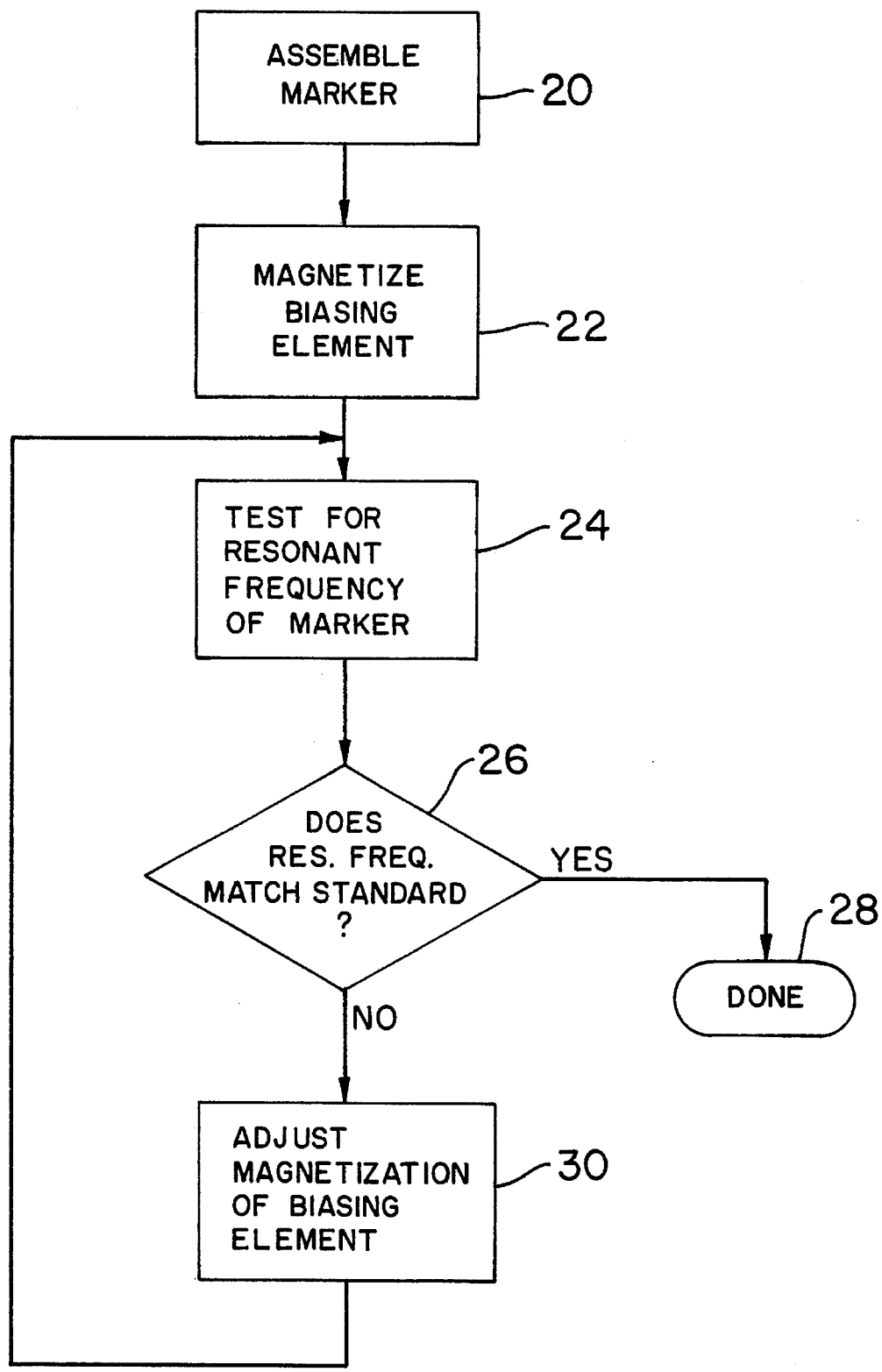
FIG. 4 is a flow chart of a procedure for making, and tuning the resonant frequency of, a magnetomechanical marker in accordance with the invention.

The procedure of FIG. 4 commences with step 20, in which a marker 10 is assembled using the components shown in FIG. 1, including a larger-than-conventional (e.g. thicker) biasing element 16. Then, at step 22, the marker 10 is exposed to a magnetic field in order to magnetize the biasing element 16 so as to provide a biasing field of a predetermined strength such as, for example, 6 Oe. Because the biasing element 16 provided in accordance with the invention is larger than a conventional biasing element, the degree of magnetization of the element 16 required to produce the 6 Oe field is less than saturation for the element 16.

Figure 5:
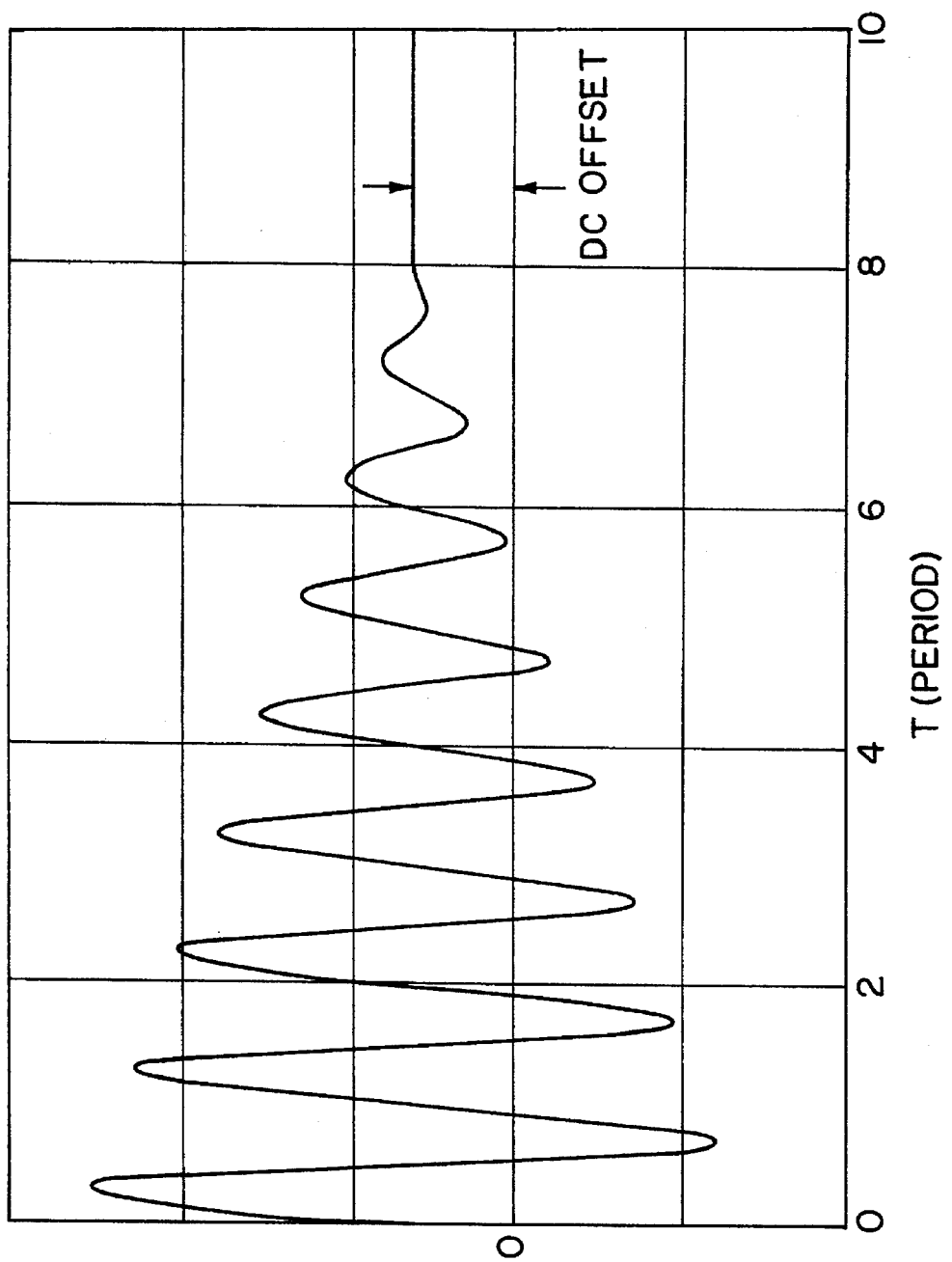
FIG. 5 is a graphical illustration of an amplitude characteristic of a magnetic field applied in accordance with the invention to magnetize a biasing element in a magnetomechanical marker.

It is within the contemplation of the invention to perform step 22 by exposing the marker 10 to a DC magnetic field. However, in order to more precisely control the degree of magnetization of the biasing element 16, it is preferred to perform step 22 by applying to the marker 10 a magnetic field having the amplitude characteristic shown in FIG. 5. In general, the characteristic curve of FIG. 5 is an AC ring-down with a DC offset. In particular, the preferred field illustrated in FIG. 5 has a DC component corresponding to the amount of the DC offset and also has an AC component that "rings down" as shown in FIG. 5 over a number of cycles of the AC component. (The AC ring down characteristic of the magnetic field shown in FIG. 5 is not to be confused with the "ring down" signal radiated by a magnetomechanical marker in response to a pulsed interrogation signal generated by an EAS system.)

The degree to which the biasing element 16 will be magnetized after exposure to the field shown in FIG. 5, and thus the strength of the resulting biasing field provided by the element 16, are, in general, dependent upon the amount of the DC offset and the initial peak value of the AC component of the applied magnetic field. The preferred parameters for the field shown in FIG. 5 are dependent, for example, on the material used in forming the element 16, and the size of the element 16, as well as the strength of the biasing field to be provided by the element 16. Suitable parameters for the AC ring-down component and the DC offset can be readily determined by those of ordinary skill in the art without undue experimentation. For a biasing element 16 of the type described above, a DC offset of about 20–30 Oe, and an AC component with an initial peak-to-peak amplitude of about 300 Oe would be satisfactory. Frequencies of the AC component in the range of about 100–500 Hz have been used successfully, but much higher frequencies may be used. The period of time over which the AC component "rings down" may be on the order of about 10 cycles of the AC component.

The AC component of the applied magnetic field shown in FIG. 5 eliminates any residual effect on the magnetization of element 16 of previous exposure of the element 16 to magnetic fields. In order to accomplish this function, it is believed that a ring-down period of at least about 10 cycles is needed, and a somewhat longer ring-down period than 10 cycles is preferred. By contrast, if only a DC field is used in step 22, there may be lingering effects of previous exposure of the element 16 to magnetic fields, so that the degree of magnetization resulting from step 22 may be less precisely controlled.

Although the amplitude of the AC component is shown in FIG. 5 as decreasing substantially linearly over the ring-down period, it is also contemplated that the AC component may be reduced nonlinearly. For example, an exponential ring-down is also within the contemplation of this invention.

Figure 6:
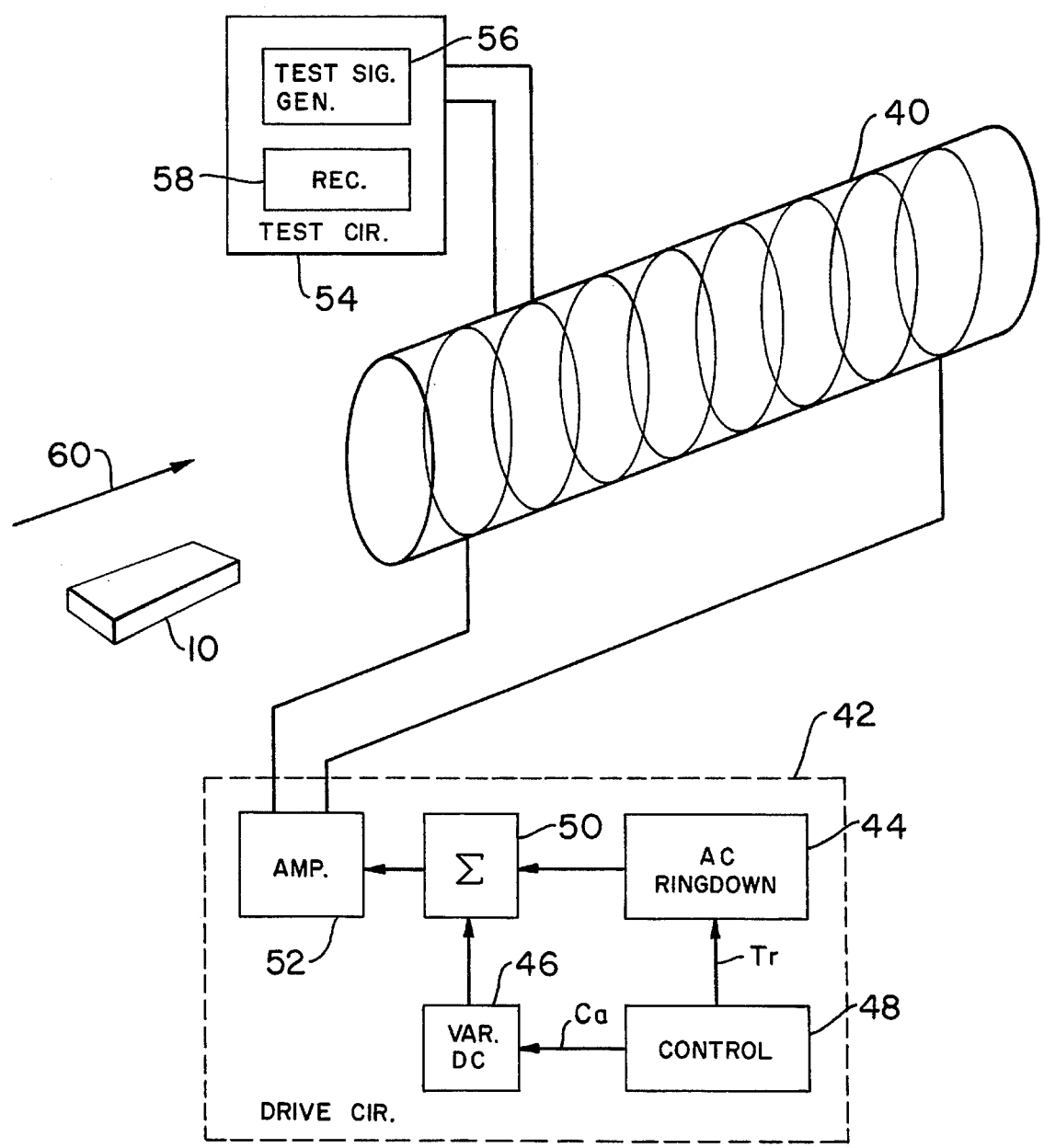
FIG. 6 is a schematic illustration of an apparatus for applying the magnetic field of FIG. 5 to a magnetomechanical marker.

An apparatus for applying the magnetic field of FIG. 5 to the marker 10 is illustrated in schematic form in FIG. 6. The apparatus of FIG. 6 includes a solenoid 40 for generating the magnetic field having the characteristic shown in FIG. 5 and a drive circuit 42 connected to the solenoid 40 for energizing the solenoid 40. The drive circuit 42 includes a AC ring-down signal generating circuit 44 for generating the AC ring-down component of the driving signal and a DC signal generating circuit 46. Preferably the DC signal generating circuit 46 is arranged so that the amplitude of the DC signal generated thereby is variable. A control circuit 48 is connected to each of the generating circuits 44 and 46. In particular, the control circuit 48 provides a trigger signal $T_R$ for triggering the generation of the AC ring-down signal by the generating circuit 44. The generating circuit 44 may be arranged so that it generates the AC ring-down signal with a predetermined initial amplitude, a predetermined duration, and a predetermined profile, in response to the trigger signal $T_R$. The control block 48 also provides an amplitude control signal $C_a$ to the DC signal generating circuit 46, and the amplitude of the DC signal output from the generating circuit 46 is determined in accordance with the control signal $C_a$.

The respective signals output from the generating circuits 44 and 46 are provided to a combining circuit 50, which combines the signals supplied thereto and outputs a combined signal having an AC ring-down component and a DC offset component. The resulting signal is supplied to a driving amplifier 52 which energizes the solenoid 40 to produce the magnetic field having the characteristic shown in FIG. 5.

Referring again to FIG. 4, after the bias element has been magnetized (step 22) the procedure advances to step 24, at which the resonant frequency of the marker 10 is tested. This testing may be carried out according to conventional techniques. For example, the marker 10 may be exposed to an interrogation signal which is swept through a frequency range, and a signal radiated by the marker 10 in response to the interrogation signal is detected to determine the resonant frequency of the marker 10. According to a preferred alternative, the marker 10 may be excited with a pulse, and then a ring-down signal radiated by the marker 10 in response to the pulse can be counted to determine the resonant frequency of the marker 10.

It is contemplated by the invention to use the same solenoid coil 40 for carrying out the testing of step 24 as was used for the magnetizing of the biasing element 16 in step 22. Accordingly, the apparatus of FIG. 6 includes a test circuit 54 connected to the solenoid 40. The test circuit 54 includes a test signal generating circuit 54 for exciting the solenoid 40 to provide a pulsed interrogation signal and a receiver circuit 58 for detecting the resonant frequency of the marker 10.

Although test circuit 54 is shown as being separate from drive circuit 42, it should be understood that the two circuits may overlap to some extent. For example, the test circuit 54 may share the amplifier 52 of the drive circuit 42. Furthermore, both of the circuits 42 and 54 may be controlled by the same control block 48.

It is also within the contemplation of this invention to provide separate equipment for respectively carrying out steps 22 and 24 of the procedure of FIG. 4.

Referring again to FIG. 4, step 26 follows step 24. At step 26, it is determined on the basis of the results of step 24 whether the marker 10 has a resonant frequency that matches the standard operating frequency for the EAS system in which the marker 10 is to be used. It has been assumed for present purposes that the standard frequency is 58 Khz. It should also be noted that there is some tolerance range around the nominal standard frequency within which the marker 10 can be satisfactorily operated. Thus the expression "matching the standard frequency" should be understood to mean that the marker has a resonant frequency within the tolerance range around the standard frequency.

If at step 26 it was determined that the marker 10 had a satisfactory resonant frequency, then the procedure is complete as indicated by step 28. Otherwise, step 30 follows step 26. At step 30 the degree of magnetization of the bias element 16 is changed by exposing the marker 10 to a suitable magnetic field so that the resonant frequency of the marker 10 is tuned to the desired standard frequency. The tuning carried out at step 30 is performed on the basis of the results of step 24. In particular, based on the deviation of the marker's resonant frequency from the desired standard frequency, the desired degree of magnetization of the biasing element 16 is determined. More specifically, an appropriate value of the DC offset shown in FIG. 5 is determined, and, according to one preferred technique, the level of the DC signal output by the DC signal generating circuit 46 of FIG. 6 is adjusted (in response to an appropriate control signal $C_a$ from control block 48) to produce the desired adjustment to the DC offset. Thus it will be seen that step 30, as well as steps 22 and 24, may be carried out using the apparatus of FIG. 6.

It will be appreciated that steps 24 and 30 should be performed on only one marker at a time. On the other hand, the magnetizing of the bias element carried out in step 22 is to a predetermined standard degree of magnetization, so that step 22 can be performed with respect to a batch consisting of a considerable number of markers 10. Accordingly, it is also contemplated by the invention that the apparatus shown in FIG. 6 may be used only in steps 24 and 30, and that a somewhat different apparatus could be used for performing step 22 with respect to batches of the markers 10. In particular, the apparatus of FIG. 6 could be modified by omitting the test circuit 54. In addition, the DC generating circuit 46 would not necessarily have to have the capability for varying the level of the DC offset, although this capability may continue to be desirable to permit compensation for the selection of a different material for use as the biasing element 16 or other changes in the design of the marker. In any event, such a modified version of the apparatus of FIG. 6 may include a conveyor or similar mechanism, schematically indicated by arrow 60 in FIG. 6, for transporting a marker 10, or a batch of markers, to and within the magnetic field generated by the solenoid 40.

The control circuit 48 may be arranged to sense via a sensing device (not shown) that the batch of markers has reached an appropriate point within the solenoid 40, and to trigger the AC ringdown generating circuit 44 at the time the batch reaches that point. It will be noted the magnetization of step 22 (FIG. 4) can be accomplished quickly, e.g. in less than one second.

Further, with regard to the steps 24 and 30, the control circuit 48 may be arranged to automatically receive the results of step 24 and then calculate appropriate parameters for step 30 based on the results of step 24, so that the testing and adjusting operations of those steps can be carried out quite quickly.

It is also contemplated to reverse the order of steps 20 and 22, so that a biasing element 16, or a batch of such biasing elements, is magnetized to a predetermined degree before each element is incorporated in its respective marker 10.

From the foregoing it will be appreciated that the present invention provides for tuning the resonant frequency of a magnetomechanical marker after assembly of the marker by adjusting the biasing field provided in the marker. This technique permits much more flexibility than the prior art technique which attempted to tune the resonant frequency of the marker in advance, based on predicted characteristics of the magnetostrictive element, by adjusting the length of the magnetostrictive element prior to assembly of the marker. For example, the tuning method of the present invention can be used to compensate for design changes, including changes in the size and/or composition of the magnetostrictive element or the biasing element, as well as compensating for material variations.

Figure 7:
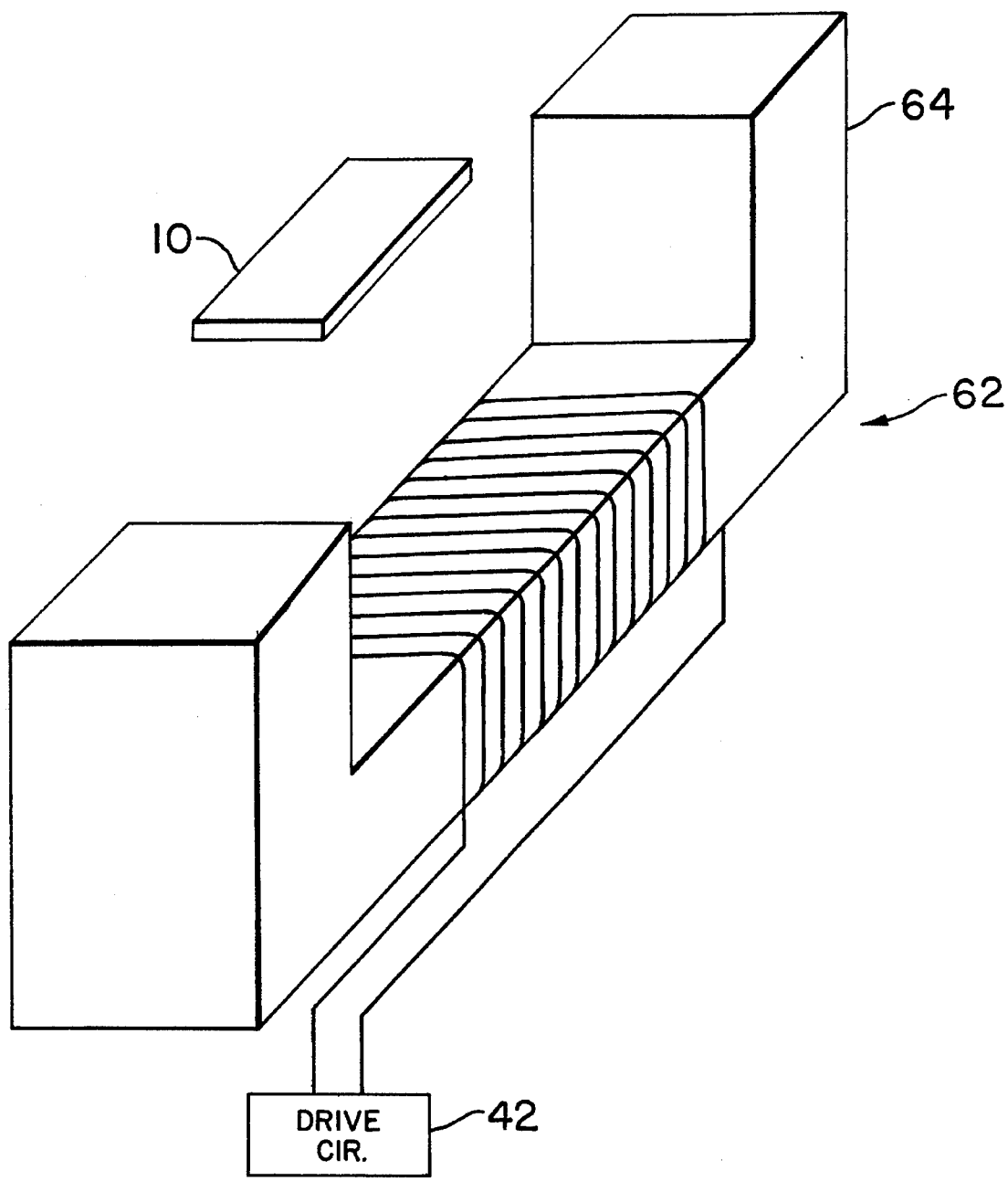
FIG. 7 is a schematic illustration of another embodiment of an apparatus for applying the magnetic field of FIG. 5 to a magnetomechanical marker.

FIG. 7 shows an alternative apparatus for generating the magnetic field shown in FIG. 5. The apparatus of FIG. 7 includes a magnetizer 62 with a U-shaped magnetic core functioning as a flux condenser. A drive circuit 42, like that of FIG. 6, is connected to the magnetizer 62 for energizing the magnetizer so that it generates a magnetic field having the characteristic as shown in FIG. 5. Although not specifically shown in FIG. 7, it will be understood that a test circuit 54 and conveying mechanism 60, like those shown in FIG. 6, may also be associated with the magnetizer 62 of FIG. 7.

Figure 8A:
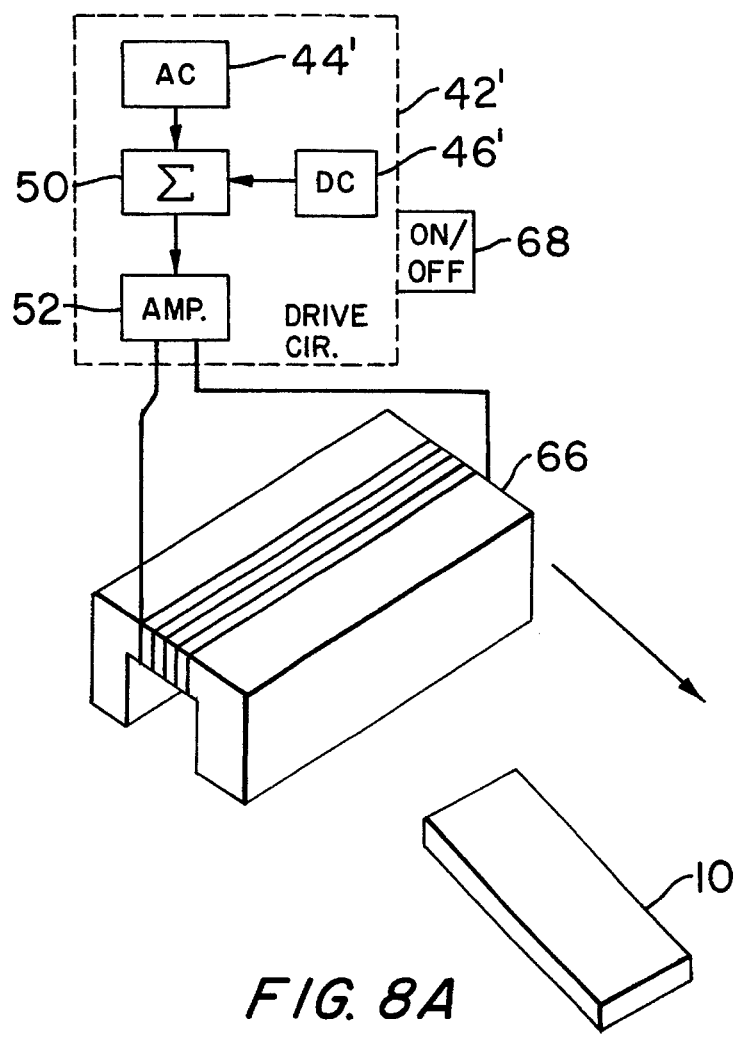
FIGS. 8A and 8B are schematic illustrations of hand held devices for magnetizing a biasing element in a magnetomechanical marker in accordance with the invention.
Figure 9:
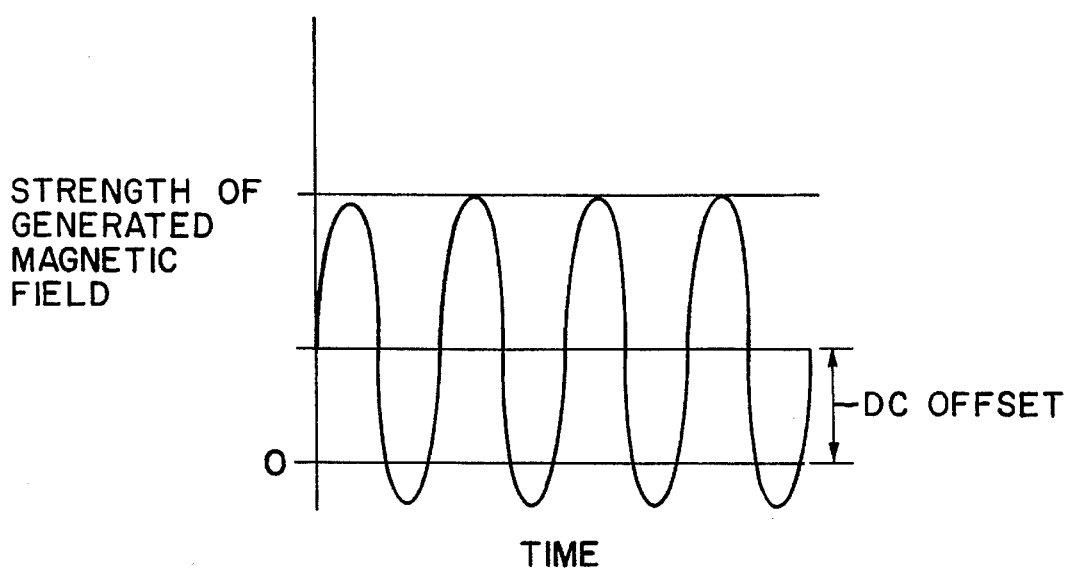
FIG. 9 graphically illustrates an amplitude characteristic of a magnetic field generated by the device of FIG. 8.

According to still further alternatives, one or both of steps 22 and 30 can be performed using a relatively simple hand held magnetizing device like that schematically illustrated in FIG. 8A. The device of FIG. 8A includes an electromagnet 66 driven by a simplified drive circuit 42'. The magnetic field generated by the device of FIG. 8A has the amplitude characteristic shown in FIG. 9. The characteristic shown in FIG. 9 is again that of a field having an AC component and a DC offset component, but the peak-to-peak amplitude of the AC component shown in FIG. 9 does not change over time. Thus the AC component shown in FIG. 9 does not "ring down".

The drive circuit 42' shown in FIG. 8A is a modification of the drive circuit 42 of FIG. 6. The combining circuit 50 and amplifying circuit 52 shown in FIG. 8A may be substantially the same as those of FIG. 6. However, the AC signal generating circuit 44' does not produce an AC ring down. Rather, the generating circuit 44' produces an AC signal having a peak-to-peak amplitude that does not change over time. Furthermore, the DC signal generating circuit 46' shown in FIG. 8A need not have a capability for varying the level of the DC signal which it outputs.

Figure 8B:
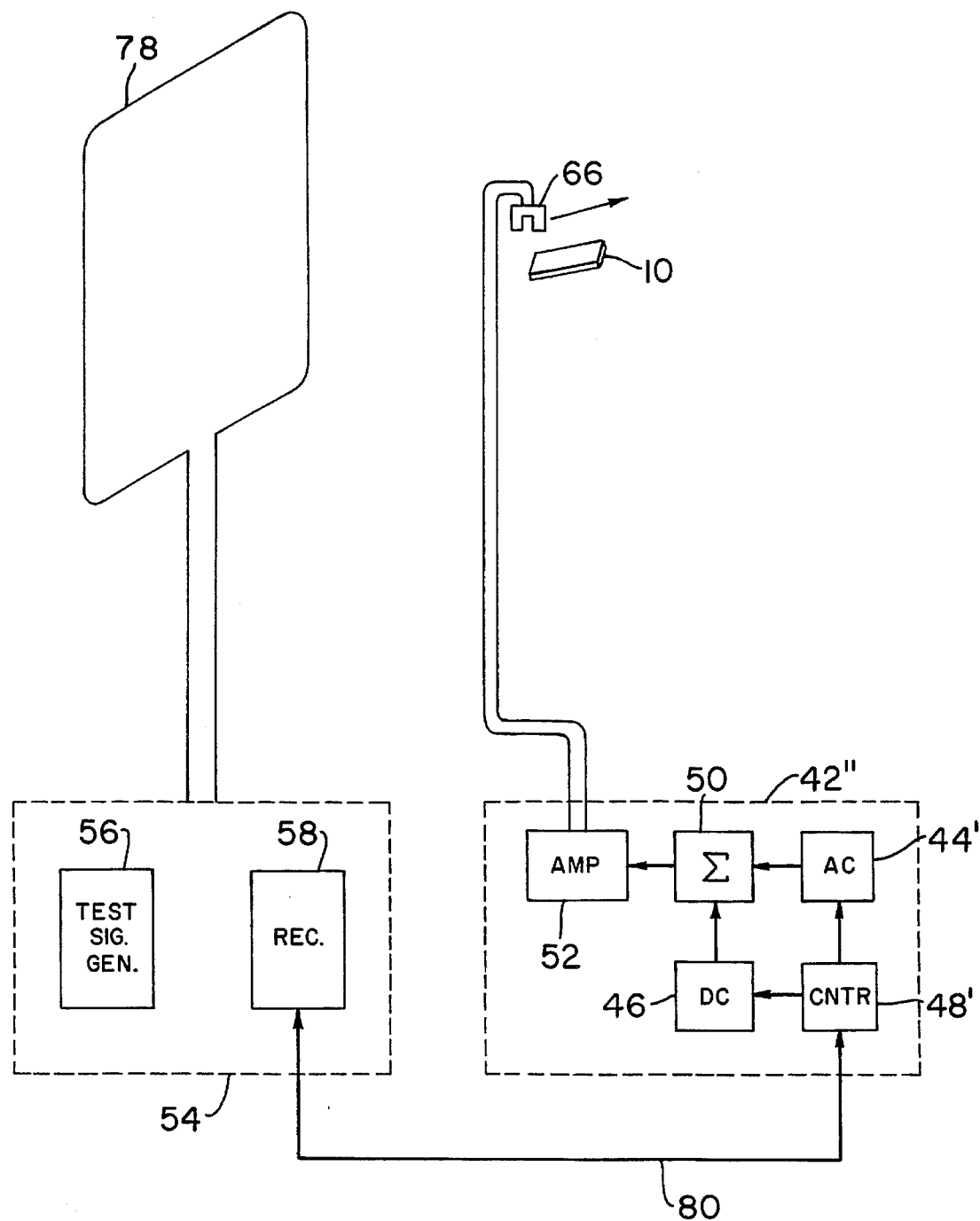

However, it is preferred that the drive circuit for the hand held magnetizing device have a variable DC offset, as shown in FIG. 8B. In the device of FIG. 8B, the drive circuit 42" is in general like the drive circuit 42 shown in FIG. 6, except that, as noted with respect to FIG. 8A, the AC signal generating circuit 44' generates an AC component that does not ring down.

There is also provided for the device of FIG. 8B, a test circuit 54, like that of FIG. 6, and connected to an antenna 78 for radiating a test signal, and for receiving a signal that is re-radiated by the marker 10 in response to the test signal. A data path 80 is provided between the control circuit 48' of drive circuit 42" and the test circuit 54. The test circuit 54 is controlled by the control circuit 48' by means of control signals transmitted from the circuit 48' to the test circuit 54 via the data path 80. In addition, results of tests performed using the test circuit 54 are transmitted from the test circuit 54 to the control circuit 48' via the signal path 80.

In using the hand held magnetizing device to perform step 22 or step 30 of FIG. 40, the device is swept over the marker 10 at a predetermined height and at a predetermined speed. At the end of such a sweeping motion, as the distance between the magnet 66 and the marker 10 increases, it will be recognized that the AC component of the field as experienced by the marker 10 will "ring down", i.e. decrease in amplitude due to the increase in distance between the magnet 66 and the marker 10. Adjustments in the degree of magnetization of the bias element 16 in the marker 10 can be accomplished, for example, by changing the relative distance between the marker 10 and the path of movement of the magnet 66 during the sweeping motion, or by changing the number of sweeping passes performed, as an alternative to providing a variable DC signal generating circuit.

As will be seen, the hand held devices shown in FIGS. 8A and 8B may also be used for reactivating a marker 10 that has previously been deactivated.

Figure 10A:
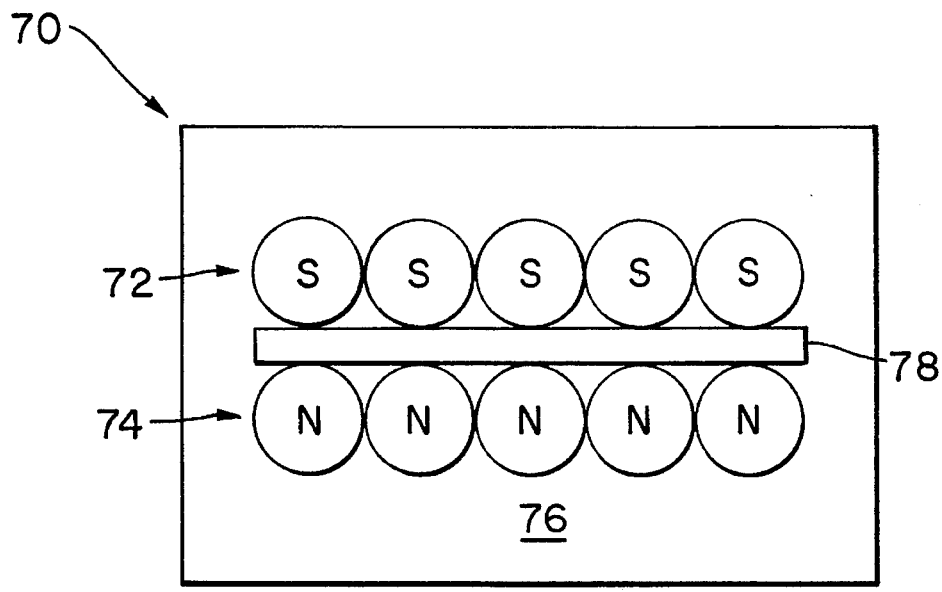
FIGS. 10A and 10B are respectively a plan view and a front side view of another hand held device for magnetizing a biasing element in a magnetomechanical marker in accordance with the invention.
Figure 10B:
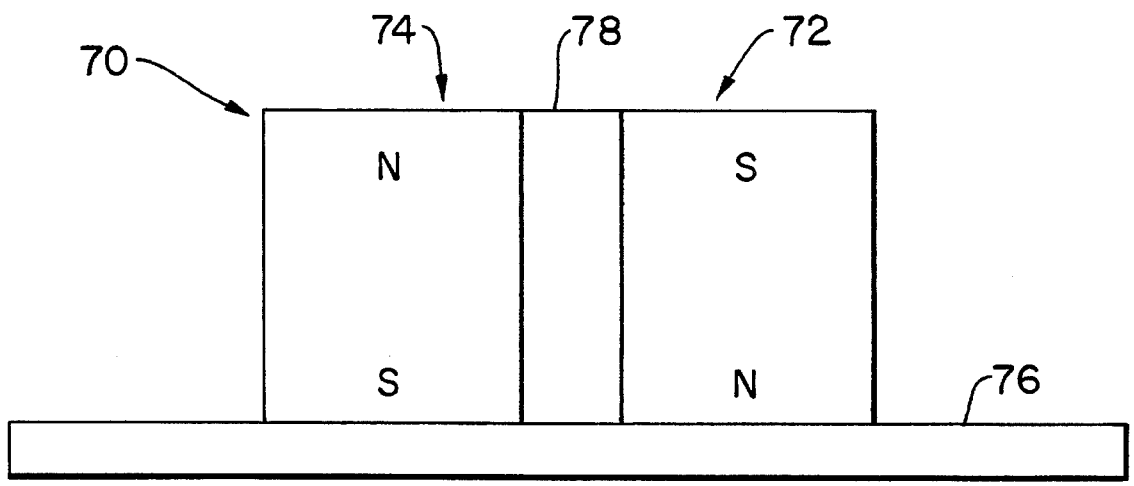

Another held hand device for magnetizing the bias element 16 of a marker 10 will now be described with reference to FIGS. 10A and 10B. As shown in FIGS. 10A and 10B, a magnetizing device, generally indicated by reference numeral 70, is formed of two parallel rows 72 and 74 of permanent magnets mounted on a steel keeper plate 76. The rows 72 and 74 of magnets are adjacent a non-magnetic spacer 78 interposed between the rows and also mounted on the keeper plate 76. All of the magnets of the row 72 are oriented in the same direction, for example, as shown in FIGS. 10A and 10B, with their north poles adjacent the keeper plate 76, while all of the magnets of the other row 74 are oriented oppositely to the magnets of row 72, i.e., in this example, all of the magnets of row 74 have their south poles adjacent the keeper plate 76. As a result, the magnetizing device 70 generates a localized DC longitudinal magnetic field which may be applied to a marker 10 for magnetizing the biasing element 16 thereof. The application of the magnetic field may be accomplished by sweeping the device 70 over the marker 10 at a predetermined fixed height. Assuming that the biasing element 16 of the marker 10 is in a predetermined initial state, preferably degaussed, the sweeping of the device 70 over the marker 10 at the predetermined height will cause the biasing element 16 to be charged to a desired biasing field strength. Thus the magnetizing device 70 may be used to perform one or both of the steps 22 and 30 discussed with reference to FIG. 4.

Markers provided in accordance with the invention may be deactivated by degaussing, in accordance with conventional practice. However, as mentioned above, if degaussing is used to deactivate the marker, and then the deactivated marker is brought into the interrogation zone of a harmonic EAS system, the marker may generate harmonic signals that are detected by the harmonic EAS system, thereby causing an alarm.

According to another well known deactivation technique, known as contact deactivation, the marker is brought into contact with, or very close to, a magnetic deactivation pad. The deactivation pad is formed of a number of longitudinally extending magnets arranged with alternating polarities to form a magnetic field having a polarity that alternates in space. Upon contact with the deactivation pad, the biasing element 16 of the marker is magnetized so as to form a biasing field that has a polarity that alternates in space. After the biasing element 16 is placed in this state, the resonant frequency of the marker is shifted by a large amount from the appropriate operating frequency and thus will not generate signals that are detectable by the magnetomechanical EAS system. At the same time, the biasing element continues to locally bias the magnetostrictive element 12, so that the magnetostrictive element 12 does not generate substantial harmonic signals in response to the interrogation signal generated by a harmonic EAS system. Thus a contact-deactivated magnetomechanical marker is not prone to causing alarms in a harmonic EAS system.

However, it is an increasingly popular practice for manufacturers to secure EAS markers on or within products at hard-to-find or otherwise inaccessible portions of the products. It will be apparent that for markers secured in this manner, it may be difficult or impossible to carry out contact deactivation. Therefore, it is a preferred approach to the present invention to provide a magnetomechanical marker which may be deactivated by saturating, rather than degaussing or contact deactivating, the biasing element 16. It is preferred, then, that the biasing element 16 be of sufficiently greater volume than a conventional biasing element so that, when saturated, the biasing element 16 provides a biasing field that is substantially stronger, e.g. twice as strong, as compared with the biasing field provided by a conventional saturated biasing element. In this case a deactivation device may be provided which generates a magnetic field strong enough to saturate the biasing element 16, thereby shifting the resonant frequency of the marker 10 sufficiently far away from the standard operating frequency of the magnetomechanical EAS system so that the marker 10 will not generate a detectable ring-down signal in response to the pulsed interrogation field of the magnetomechanical EAS system. Furthermore, since the magnetostrictive element 12 of the marker continues to be biased by the saturated biasing element 16 after such a deactivation procedure, the magnetostrictive element 12 does not produce a detectable level of harmonic signals in response to an interrogation signal from a harmonic EAS system. Thus deactivation by saturating the biasing element can be conveniently performed in a field generated by a deactivation device, and without having to bring the marker in contact with a deactivation device, while providing a deactivated state of the marker which does not cause the marker to generate alarms in a harmonic EAS system.

Another advantage of deactivation by saturating the biasing element is that such deactivation is very reliable, and avoids occasional problems encountered when an attempt to deactivate the marker by degaussing fails to sufficiently shift the marker's resonant frequency. In these rare cases, the marker unintendedly continues to generate a ring-down signal that is detectable by a magnetomechanical EAS system.

It is within the contemplation of the invention to use the handheld devices of FIGS. 8 and 10A/10B to reactivate a previously deactivated marker. Because of the AC component provided by the device of FIG. 8, such device can readily be used to reactivate markers deactivated by saturation, degaussing or contact deactivation. On the other hand, the devices of FIGS. 10A/10B would be used most effectively to reactivate a marker that has been deactivated by degaussing.

Figure 11A:
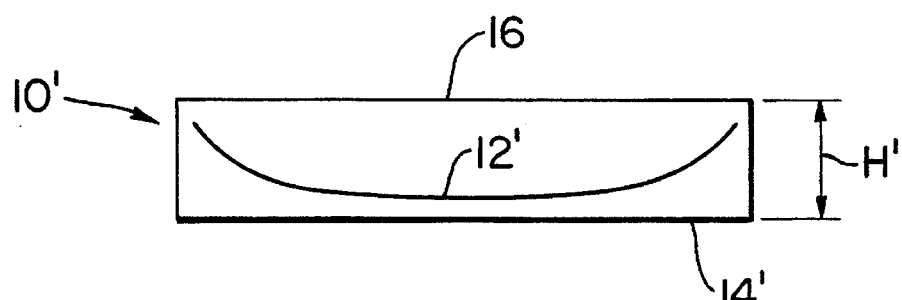
FIGS. 11A and 11B are respectively schematic elevational views in section of a marker according to the prior art and a marker provided according to the invention.
Figure 11B:
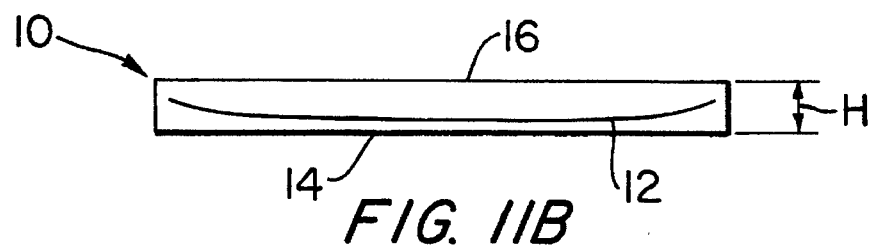

Another advantage provided by the present invention that it permits manufacture of magnetomechanical markers having a thinner profile than conventional magnetomechanical markers. FIG. 11A shows a marker 10' in accordance with the prior art, including a magnetostrictive strip 12'. As somewhat schematically illustrated in FIG. 11A, there is a significant degree of curling in the strip 12' believed to be due to residual stress. Therefore, the housing 14' provided for a conventional marker 10' must have a relatively great height H' to accommodate the curled strip 12' without inhibiting the desired magnetomechanical resonance of the strip. It is possible to anneal the magnetostrictive strip in order to relieve stress and reduce the curling of the strip, but doing so tends to change the magnetostrictive properties of the strip so that, if conventional manufacturing techniques are used, the resulting marker may fail to exhibit the desired standard resonant frequency. However, by using the testing and tuning techniques disclosed herein, any changes in the magnetostrictive element's properties caused by annealing can be compensated for after assembly of the marker, by adjusting the degree of magnetization of the biasing element to tune the marker's resonant frequency to the desired standard frequency. Accordingly, as shown in FIG. 11B, a strip 12 can be annealed to reduce curling prior to assembly of the marker 10, so that a housing 14 can be provided which has a much lower profile than the conventional marker 10', and a height H that is much less than the height H of the conventional marker. For example, a housing 14' having H'=70–110 mils may be needed to accommodate a conventional 1 mil thick strip 12', but if such a strip is annealed in accordance with the invention, with subsequent resonant frequency tuning to be performed after assembly of the marker, then the strip 12 can be provided in an essentially flat condition, so that the housing 14 of the marker 10 prepared in accordance with the invention need only have a height H=5 to 30 mils. This provides for a thinner marker that is more conveniently attached to merchandise. Markers that are thinner or less bulky are much more desirable. The overall thickness of the housing for a marker is also dependent on the thickness and uniformity of the material used to form the housing.

FIG. 12 illustrates a pulsed-interrogation EAS system which uses the magnetomechanical marker fabricated in accordance with the invention. The system shown in FIG. 12 includes a synchronizing circuit 200 which controls the operation of an energizing circuit 201 and a receiving circuit 202. The synchronizing circuit 200 sends a synchronizing gate pulse to the energizing circuit 201, and the synchronizing gate pulse activates the energizing circuit 201. Upon being activated, the energizing circuit 201 generates and sends an interrogation signal to interrogating coil 206 for the duration of the synchronizing pulse. In response to the interrogation signal, the interrogating coil 206 generates an interrogating magnetic field, which, in turn, excites the marker 10 into mechanical resonance.

Upon completion of the pulsed interrogating signal, the synchronizing circuit 200 sends a gate pulse to the receiver circuit 202, and the latter gate pulse activates the circuit 202. During the period that the circuit 202 is activated, and if a marker is present in the interrogating magnetic field, such marker will generate in the receiver coil 207 a signal at the frequency of mechanical resonance of the marker. This signal is sensed by the receiver 202, which responds to the sensed signal by generating a signal to an indicator 203 to generate an alarm or the like. In short, the receiver circuit 202 is synchronized with the energizing circuit 201 so that the receiver circuit 202 is only active during quiet periods between the pulses of the pulsed interrogation field.

Various changes in the foregoing markers and apparatus and modifications in the described practices may be introduced without departing from the invention. The particularly preferred embodiments of the invention are thus intended in an illustrative and not limiting sense. The true spirit and scope of the invention is set forth in the following claims.

What is claimed is:

1. A method of making a marker for use in a magnetomechanical electronic article surveillance system, the method comprising the steps of:

(a) providing an amorphous magnetostrictive element;

(b) mounting a biasing element adjacent to said magnetostrictive element;

(c) magnetizing said biasing element to a degree of magnetization that is substantially less than saturation;

(d) detecting a resonant frequency of said marker after said mounting and magnetizing steps; and (e) if said detected resonant frequency does not match a predetermined operating frequency of said electronic article surveillance system, adjusting the degree of magnetization of said biasing element so as to tune the resonant frequency of said marker to said predetermined operating frequency.

2. A method according to claim 1, wherein said magnetizing step is performed after said mounting step.

3. A method according to claim 1, wherein said step of providing said magnetostrictive element includes cutting an amorphous material to form a batch of at least 10 strips each having a preselected fixed uniform length.

4. A method according to claim 1, wherein said magnetizing step includes applying to said biasing element a magnetic field which has an AC component and a DC offset component.

5. A method according to claim 4, wherein said AC component of said magnetic field has a ring-down characteristic.

6. A method according to claim 1, wherein said magnetizing step includes applying to said biasing element a DC magnetic field.

7. A method according to claim 1, further comprising the step of annealing said magnetostrictive element, prior to said mounting step, to reduce curling of said magnetostrictive element.

8. A marker for use in a magnetomechanical electronic article surveillance system, comprising:

(a) an amorphous magnetostrictive element; and (b) a biasing element located adjacent to said magnetostrictive element and magnetized so as to provide a biasing magnetic field for said magnetostrictive element, said biasing element having a degree of magnetization that is substantially less than saturation.

9. A marker according to claim 8 wherein said magnetostrictive element was annealed to reduce curling of said magnetostrictive element.

10. A magnetomechanical electronic article surveillance system comprising:

(a) generating means for generating an electromagnetic field alternating at a selected frequency in an interrogation zone, said generating means including an interrogation coil;

(b) a marker secured to an article appointed for passage through said interrogation zone, said marker including an amorphous magnetostrictive element and a biasing element located adjacent to said magnetostrictive element, said biasing element being magnetically biased to cause said magnetostrictive element to be mechanically resonant when exposed to said alternating field, said biasing element having a degree of magnetization that is substantially less than saturation; and (c) detecting means for detecting said mechanical resonance of said magnetostrictive element.

11. A magnetomechanical electronic article surveillance system according to claim 10, wherein said magnetostrictive element was annealed to reduce curling of said magnetostrictive element.

12. A method of making a marker for use in a magnetomechanical electronic article surveillance system, comprising the steps of:

(a) forming said marker by mounting a biasing element adjacent to a magnetostrictive element, said magnetostrictive element having a resonant frequency that varies according to a level of a biasing magnetic field provided by said biasing element; and (b) after said forming step, setting the resonant frequency of said magnetostrictive element to a predetermined frequency by changing a degree of magnetization of said biasing element.

13. A method according to claim 12, wherein said setting step includes testing said marker to detect the resonant frequency of said magnetostrictive element, and if said detected resonant frequency does not match said predetermined frequency, applying a magnetic field to said biasing element to change the degree of magnetization of said biasing element.

14. A method according to claim 13, wherein said magnetic field applied to said biasing element includes an AC component and a DC offset component.

15. A method according to claim 14, wherein said magnetic field applied to said biasing element is a DC magnetic field.

16. A method of making a marker for use in a magnetomechanical electronic article surveillance system, comprising the steps of:

(a) selecting an amorphous magnetic material;

(b) cutting the said material to a strip having a preselected fixed uniform length;

(c) mounting said strip adjacent to a biasing element; and (d) setting a resonant frequency of said magnetostrictive element to a desired frequency by changing a degree of magnetization of said biasing element.

17. A method according to claim 16, wherein said cutting step is performed by cutting the said material to form a batch of strips cut to said preselected fixed uniform length, said batch including at least 10 strips.

18. A method according to claim 16, wherein said setting step includes testing said marker to detect the resonant frequency of said magnetostrictive element, and if said detected resonant frequency does not match said desired frequency, applying a magnetic field to said biasing element to change the degree of magnetization of said biasing element.

19. A method according to claim 18, wherein said magnetic field applied to said biasing element includes an AC component and a DC offset component.

20. A method according to claim 18, wherein said magnetic field applied to said biasing element is a DC magnetic field.

21. A marker for use in a magnetomechanical electronic article surveillance system, comprising:

(a) a magnetostrictive element made by selecting an amorphous magnetic material and cutting said material to a strip having a preselected fixed uniform length; and (b) a biasing element mounted adjacent said magnetostrictive element for providing a biasing magnetic field such that said magnetostrictive element exhibits magnetostrictive properties at a predetermined mechanical resonant frequency, said biasing element having a degree of magnetization that is less than saturation.

22. A magnetomechanical electronic article surveillance system comprising:

(a) generating means for generating an electromagnetic field alternating at a selected frequency in an interrogation zone, said generating means including an interrogation coil;

(b) a marker secured to an article appointed for passage through said interrogation zone, said marker including a magnetostrictive strip made by selecting an amorphous magnetic material and cutting said material to a strip having a preselected fixed uniform length, said marker also including a biasing element located adjacent to said magnetostrictive strip, said biasing element providing a biasing magnetic field such that said magnetostrictive strip is mechanically resonant when exposed to said alternating field, said biasing element having a degree of magnetization that is less than saturation; and (c) detecting means for detecting said mechanical resonance of said magnetostrictive element.

23. An apparatus for magnetizing a biasing element for use in an electronic article surveillance system, the apparatus comprising:

(a) a coil for generating a magnetic field to which said biasing element is exposed; and (b) a driving circuit for energizing said coil, including:

(b1) AC signal generating means for generating an AC signal having a ring-down characteristic;

(b2) DC signal generating means for generating a DC signal;

(b3) means for combining said AC signal having said ring-down characteristic and said DC signal to form a driving signal which includes an AC ring-down component and a DC offset component; and (b4) means for applying said driving signal to said coil whereby said magnetic field generated by said coil has an AC ring-down component and a DC offset component.

24. An apparatus according to claim 23, wherein said DC signal generating means includes means for varying a level of said DC signal so that a level of said DC offset component of said magnetic field is varied.

25. An apparatus according to claim 23, further comprising means for transporting said biasing element in said magnetic field.

26. A method of activating and deactivating a marker provided for use in a magnetomechanical electronic article surveillance system which operates at a predetermined operating frequency, comprising the steps of:

(a) forming said marker by mounting a biasing element adjacent to a magnetostrictive element, said magnetostrictive element having a resonant frequency that varies according to a level of a biasing magnetic field provided by said biasing element;

(b) after said forming step, setting the resonant frequency of said magnetostrictive element to said predetermined operating frequency by changing a degree of magnetization of said biasing element; and (c) after said setting step, detuning said marker by changing said degree of magnetization of said biasing element so that the resonant frequency of said magnetostrictive element is shifted from said predetermined operating frequency.

27. A method according to claim 26, wherein, after said detuning step, said degree of magnetization of said biasing element is such that said magnetostrictive element does not produce detectable harmonic frequencies when said marker is in an alternating electromagnetic field.

28. A method according to claim 27, wherein said detuning step includes increasing said degree of magnetization of said biasing element.

29. A method according to claim 28, wherein said detuning step includes saturating said biasing element by applying a DC magnetic field to said marker.

30. A method according to claim 29, wherein said setting step includes applying to said marker a magnetic field which includes an AC component and a DC component.

31. A method of operating a magnetomechanical electronic article surveillance system, comprising the steps of:

(a) providing generating means for generating an electromagnetic field alternating at a selected operating frequency in an interrogation zone, said field being generated in pulses, and detecting means for detecting reradiated signals at said selected operating frequency during quiet periods between said pulses;

(b) forming a marker by mounting a biasing element adjacent to a magnetostrictive element, said magnetostrictive element having a resonant frequency that varies according to a level of a biasing magnetic field provided by said biasing element;

(c) after said forming step, setting the resonant frequency of said magnetostrictive element to said selected operating frequency by changing a degree of magnetization of said biasing element;

(d) after said setting step, securing said marker to an article appointed for passage through said interrogation zone; and (e) prior to passage of said article through said interrogation zone, deactivating said marker secured to said article by changing said degree of magnetization of said biasing element so that the resonant frequency of said magnetostrictive element is shifted from said selected operating frequency.

32. A method according to claim 31, wherein, after said deactivating step, said degree of magnetization of said biasing element is such that said magnetostrictive element does not produce detectable harmonic frequencies when said marker is in an alternating electromagnetic field.

33. A method according to claim 32, wherein said deactivating step includes increasing said degree of magnetization of said biasing element.

34. A method according to claim 33, wherein said deactivating step includes saturating said biasing element by applying a DC magnetic field to said marker.

35. A method according to claim 33, wherein said setting step includes applying to said marker a magnetic field which includes an AC component and a DC component.

\* \* \* \* \*